United States Patent
Murtaza et al.

(10) Patent No.: US 12,489,387 B2
(45) Date of Patent: Dec. 2, 2025

(54) MONITORING CONTROL SIGNALS OF POWER SWITCHES IN A HALF BRIDGE FOR MOTOR CONTROL OR OTHER APPLICATIONS

(71) Applicant: Infineon Technologies AG, Neubiberg (DE)

(72) Inventors: Diana Raluca Murtaza, Bucharest (RO); Cristian Murtaza, Bucharest (RO); Peter Stemplinger, Madrid (ES)

(73) Assignee: Infineon Technologies AG, Neubiberg (DE)

( * ) Notice: Subject to any disclaimer, the term of this patent is extended or adjusted under 35 U.S.C. 154(b) by 205 days.

(21) Appl. No.: 18/354,491

(22) Filed: Jul. 18, 2023

(65) Prior Publication Data
US 2025/0030372 A1     Jan. 23, 2025

(51) Int. Cl.
H02P 29/00     (2016.01)
H03K 17/687   (2006.01)
H03K 19/0175  (2006.01)

(52) U.S. Cl.
CPC .......... H02P 29/00 (2013.01); H03K 17/6874 (2013.01); H03K 19/017545 (2013.01); H03K 2217/0063 (2013.01); H03K 2217/0072 (2013.01)

(58) Field of Classification Search
CPC .......... H03K 17/00; H03K 19/00; H02P 29/00
See application file for complete search history.

(56) References Cited

U.S. PATENT DOCUMENTS

| | | |
|---|---|---|
| 6,271,709 B1 | 8/2001 | Kimura et al. |
| 6,545,513 B2 | 4/2003 | Tsuchida et al. |
| 8,729,929 B2 | 5/2014 | Kawamoto et al. |
| 10,651,723 B1 | 5/2020 | Frank et al. |
| 10,667,363 B1 | 5/2020 | Chen et al. |
| 10,790,813 B2 | 9/2020 | Mukunoki et al. |
| 10,790,818 B1 | 9/2020 | Frank |
| 11,545,969 B1 | 1/2023 | Murtaza et al. |
| 2019/0280635 A1* | 9/2019 | D'Angelo ............... H02P 6/085 |
| 2020/0295759 A1 | 9/2020 | Akahane |
| 2022/0006416 A1 | 1/2022 | Song |
| 2023/0087438 A1 | 3/2023 | Zannoth et al. |

* cited by examiner

Primary Examiner — Said Bouziane
(74) Attorney, Agent, or Firm — Shumaker & Sieffert, P.A.

(57) ABSTRACT

In some examples, this disclosure describes a method of controlling a high-side power switch and a low-side power switch arranged in a half bridge configuration. The method may comprise driving the gate of the high-side power switch based on high-side pulse modulation (PM) signals; driving a gate of the low-side power switch based on low-side PM signals; and monitoring the high-side PM signals and the low-side PM signals. The high-side PM signals and the low-side PM signals are configured to turn the high-side power switch and the low-side power switch ON and OFF in a complementary fashion, and monitoring may include: detecting one or more absences of either the high-side PM signals or the low-side PM signals; and generating a fault signal in response to detecting the one or more absences.

23 Claims, 10 Drawing Sheets

MONITORING CONTROL SIGNALS OF POWER SWITCHES IN A HALF BRIDGE FOR MOTOR CONTROL OR OTHER APPLICATIONS

TECHNICAL FIELD

This disclosure relates to driver circuits for power switches, and more specifically, techniques and circuits for monitoring the operation of power switches configured in a half bridge.

BACKGROUND

Power switches are used in a wide variety of applications in order to control power being delivered to a load. As examples, a power switch may comprise a Field Effect Transistor (FET), an insulated gate bipolar transistor (IGBT), a bipolar junction transistor (BJT), or another type of power transistor. Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials.

Power switches are typically controlled by a driver circuit via a pulse modulation (PM) signals. PM signals generally refer to pulse width modulation (PWM) signals, pulse frequency modulation (PFM) signals, pulse duration modulation signals, pulse density modulation signals, or another type of modulated control signal used to control a power switch. PM control signals may be generated by a processor and communicated to a driver circuit. The driver circuit may amplify the PM control signals to generate PM drive signals, which can be applied to the gate of a power switch so as to control on/off switching of the power switch, and thereby control the average amount of power delivered through the power switch to a load. The on/off switching of the power switch effectively chops its power delivery up into discrete parts. The average value of voltage and/or current fed to a load can be controlled by turning the switch ON and OFF at a fast rate. The longer the switch is on compared to the off periods, the higher the total power supplied to the load.

In many applications, two different power switches are configured in a high-side and low-side configuration, and the ON-OFF switching of the two power switches is synchronized in order to deliver the desired power to a switch node positioned between the high-side and low-side switch. Moreover, in some systems, different sets of high-side and low-side switches may be used to control different phases of multi-phase device, such as a multi-phase electrical motor.

SUMMARY

This disclosure describes circuits and techniques for monitoring control signals for power switches, e.g., so-called pulse modulation (PM) signals associated with a high-side power switch and a low-side power switch arranged in a half bridge configuration. According to this disclosure, a half bridge circuit is controlled in a complementary fashion, whereby the low-side power switch is ON when the high-side power switch is OFF and the high-side power switch is ON when the low-side power switch is OFF. The techniques of this disclosure may include monitoring PM signals associated with a driver circuit that controls the high-side power switch and the low-side power switch of a half bridge circuit. The expectation, when operating correctly, is that low-side power switch is controlled ON by the PM signals when the high-side power switch is controlled OFF by the PM signals, and the high-side power switch is controlled ON by the PM signals when the low-side power switch is controlled OFF by the PM signals. According to this disclosure, the driver circuit may be configured to detect one or more absences of either the high-side PM signals or the low-side PM signals. The driver circuit may be further configured to generate a fault signal in response to detecting the one or more absences. In this case, the one or more missing PM signals on either the high-side or the low-side may indicate a problem with the circuit or the PM signals.

In some examples, this disclosure describes a driver circuit configured to control a high-side power switch and a low-side power switch arranged in a half bridge configuration. The driver circuit may comprise a high-side driver configured to drive a gate of the high-side power switch based on high-side PM signals, and a low-side driver configured to drive a gate of the low-side power switch based on low-side PM signals. The driver circuit may further comprise a logic circuit configured to monitor the high-side PM signals and the low-side PM signals. The high-side PM signals and the low-side PM signals are configured to turn the high-side power switch and the low-side power switch ON and OFF in a complementary fashion. The logic circuit is configured to detect one or more absences of either the high-side PM signals or the low-side PM signals and generate a fault signal in response to detecting the one or more absences.

In some examples, this disclosure describes a method of controlling a high-side power switch and a low-side power switch arranged in a half bridge configuration. The method comprises: driving the gate of the high-side power switch based on high-side PM signals; driving a gate of the low-side power switch based on low-side PM signals; and monitoring the high-side PM signals and the low-side PM signals. The high-side PM signals and the low-side PM signals are configured to turn the high-side power switch and the low-side power switch ON and OFF in a complementary fashion. Monitoring the high-side PM signals and the low-side PM signals includes detecting one or more absences of either the high-side PM signals or the low-side PM signals; and generating a fault signal in response to detecting the one or more absences.

In some examples, this disclosure describes a system comprising: a three-phase electric motor; and a plurality of half bridge circuits each comprising a high-side power switch and a low-side power switch arranged in a half bridge configuration, wherein each of the half bridge circuits controls a respective phase of the three-phase electric motor. For each of the plurality of half bridge circuits, a respective driver circuit is configured to control the high-side power switch and the low-side power switch, and a processor is configured to generate control signals for each of the respective driver circuits. According to this disclosure, each of the respective driver circuits includes a logic circuit configured to monitor high-side PM signals and low-side PM signals. The high-side PM signals and the low-side PM signals are configured to turn the high-side power switch and the low-side power switch ON and OFF in a complementary fashion, and the logic circuit is configured to detect one or more absences of either the high-side PM signals or the low-side PM signals and generate a fault signal in response to detecting the one or more absences.

Details of these and other examples are set forth in the accompanying drawings and the description below. Other features, objects, and advantages will be apparent from the description and drawings, and from the claims.

DETAILED DESCRIPTION

Figure 1:
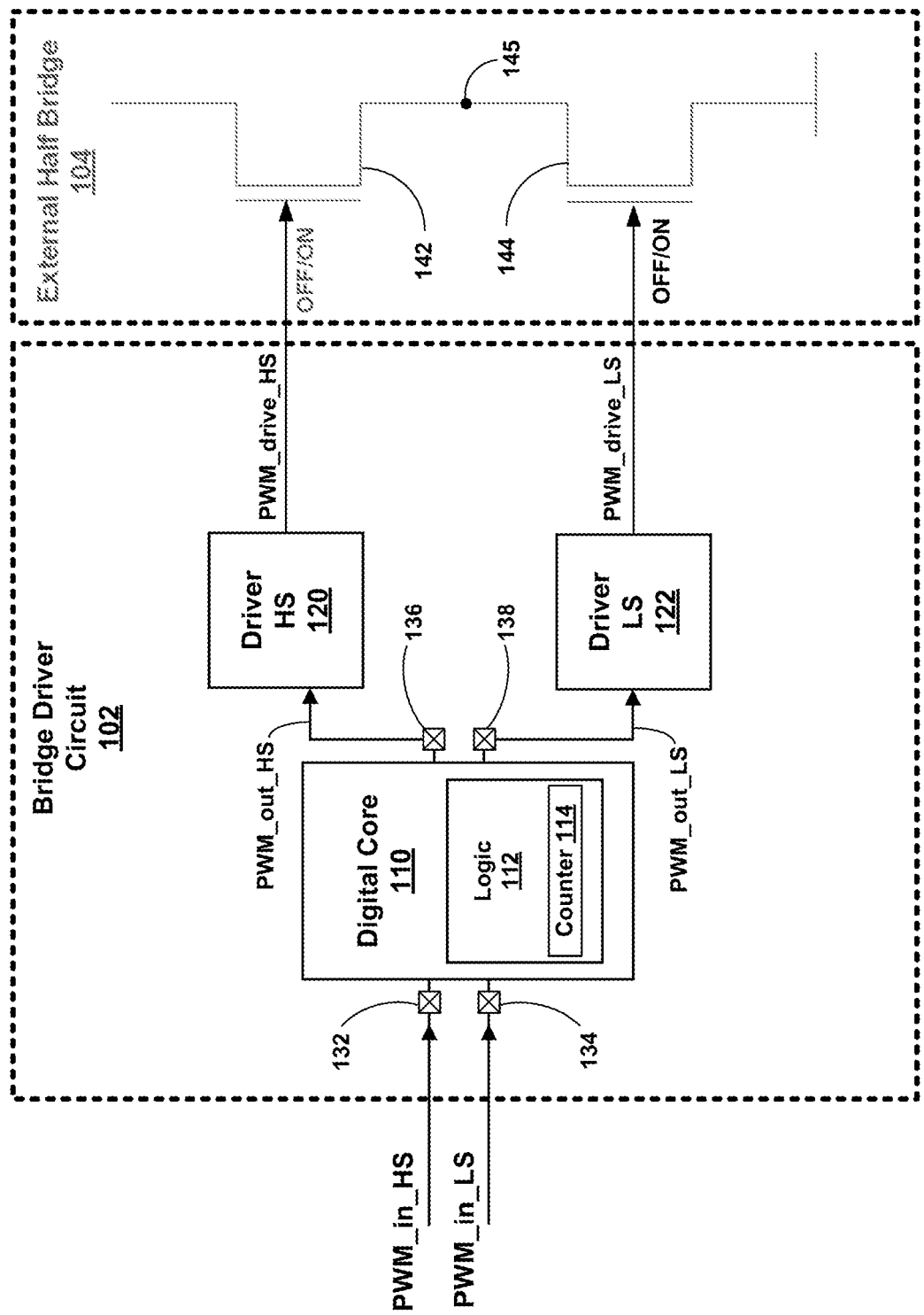
FIG. 1 is a block diagram showing a bridge driver circuit configured to control power switches of an external half bridge circuit.

This disclosure describes circuits and techniques for monitoring control signals for power switches, e.g., so-called pulse modulation (PM) signals associated with a high-side power switch and a low-side power switch arranged in a half bridge configuration. The techniques may be useful for motor control or other applications where half bridge circuits are used. For motor control, the techniques may be applied by one or more driver circuits that control several different half bridge circuits in order to control different phases of a multi-phase electrical motor. Half bridge circuits are also referred to herein as "half bridges."

According to this disclosure, the half bridge circuit is controlled in a complementary fashion, whereby the low-side power switch is ON when the high-side power switch is OFF and the high-side power switch is ON when the low-side power switch is OFF. The techniques of this disclosure may include monitoring PM signals associated with a driver circuit of the high-side power switch and the low-side power switch of a half bridge circuit. The expectation is that low-side power switch is controlled ON by the PM signals when the high-side power switch is controlled OFF by the PM signals, and the high-side power switch is controlled ON by the PM signals when the low-side power switch is controlled OFF by the PM signals. The driver circuit may be configured to detect one or more absences of either the high-side PM signals or the low-side PM signals. The driver circuit may be further configured to generate a fault signal in response to detecting the one or more absences.

In some cases, a single missing PM signal in either the high-side or the low-side may indicate a circuit problem or a signaling problem. However, generating a fault in response to a single missing PM signal may also result in false alarms or improper faults. Therefore, in some examples, a counter can be used to detect successive instances of missing (yet expected) high-side PM signals or low-side PM signals. In this case, the driver circuit may be configured to generate a fault signal in response to detecting a plurality of successive absences, e.g., two or more successive absences, which likely indicates a signaling problem in the driver circuit or elsewhere.

PM signals may comprise input control signals from a processor to a driver circuit, input signals from a digital core of the driver circuit to high-side and low-side drivers, or output signals from the high-side and low-side drivers. Monitoring these different locations of PM signals can provide different advantages and drawbacks relative to one another. In some cases, monitoring can be performed at each of these different PM signals, which may help to pinpoint a circuit element or location that is likely causing the problems. When monitoring the output signals from the high-side and low-side drivers, a level shifting operation may also be desirable to improve the ability to monitor the signals within a smaller voltage range that that defined by the drive signals applied to the gates of the power switches. Several different examples are described in more detail below.

FIG. 1 is a block diagram bridge driver circuit 102 configured to control power switches 142, 144 of an external half bridge circuit 104. Power switches 142 and 144 are arranged in a half bridge configuration. High-side power switch 142 may be coupled to a first supply side (e.g., a supply voltage), and low-side power switch 144 may be coupled to a second supply side (e.g., a ground). A switch node 145 located between high-side power switch 142 and low-side power switch 144 may correspond to a control node for another device. For example, switch node 145 may be connected to a multi-phase electric motor and external half bridge circuit 104 may be configured to control a phase of the multi-phase electric motor.

Bridge driver circuit 102 includes a high-side driver 120 configured to drive a gate of high-side power switch 142 based on high-side pulse PM signals and bridge driver circuit 102 also include a low-side driver 122 configured to drive a gate of the low-side power switch 144 based on low-side PM signals. The high-side PM signals and the low-side PM signals are generally configured to turn high-side power switch 142 and low-side power switch 144 ON and OFF in a complementary fashion. In other words, in operating in complementary fashion, low-side power switch 144 is controlled ON when high-side power switch 142 is controlled OFF and high-side power switch 142 is controlled ON when low-side power switch 144 is controlled OFF.

In the example shown in FIG. 1, bridge driver circuit 102 includes a digital core 110, which may comprise a digital interface with an external processor (not shown in FIG. 1). The external processor may be connected to bridge driver circuit 102 via input pins 132, 134 to digital core 110. High-side driver 120 and low-side driver 122 may be connected to digital core via pins 136, 138. Output pins (not shown in FIG. 1) may connect high-side driver 120 to high-side power switch 142, and may connect low-side driver 122 to low-side power switch 144.

High-side driver 120 and low-side driver 122 may be configured to generate PM drive signals (e.g., PWM_drive_HS and PWM_drive_LS) based on PM control signals (e.g., PWM_out_HS and PWM_out_LS). High-side driver 120 and low-side driver 122, for example, may each comprise an amplifier, a DC/DC power converter, a regulator, and/or one or more power switches that can generate PM drive signals at the voltage level needed for controlling high-side power switch 142 and low-side power switch 144.

The PM signals generally refer to any of the PWM signals illustrated in FIG. 1. Accordingly, the PM signals may take different forms (e.g., different voltage levels or amplitudes) as the signals propagate through bridge driver circuit 102. In general, however, PM signals typically comprise square waves that define a high level (ON) and a low level (OFF). For example, the PM signals may comprise PWM_in_HS and PWM_in_LS, PWM_out_HS and PWM_out_LS, or PWM_drive_HS and PWM_drive_LS. This disclosure describes the monitoring of PM signals to detect undesirable absences, and monitoring different types of PM signals may have different benefits.

In the example shown in FIG. 1, digital core 110 includes a logic circuit 112 configured to monitor the high-side PM signals and the low-side PM signals. In this example, the monitored signals correspond to PMW_in_HS and PWM_in_LS, which are received from the external processor at input pins 132, 134. Logic circuit 112 is configured to detect one or more absences of either the high-side PM signals or the low-side PM signals and generate a fault signal (e.g., back to the external processor or to another controller) in response to detecting the one or more absences. For example, logic circuit 112 may be configured to communicate the fault signal to the processor.

In some cases, a single missing PM signal in either the high-side or the low-side may indicate a circuit problem or a signaling problem. However, generating a fault in response to a single missing PM signal may also result in false alarms or improper faults. Accordingly, in order to reduce possible false alarms, logic circuit 112 includes a counter 114 configured to count successive absences of either the high-side PM signals or the low-side PM signals and logic circuit 112 may be configured to generate the fault signal in response to a count value of counter 114 reaching a count threshold. In this way, counter 114 operates as a filtering mechanism, which requires successive absent (albeit expected) PM signals before logic circuit 112 generates the fault signal. The count threshold, e.g., may be greater than 1 and less than 8. For motor control applications, a count threshold of 3 is typically sufficient to quickly identify problems while also limiting false alarms.

Again, in the example shown in FIG. 1, high-side driver 120 is configured to generate high-side PM drive signals (PWM_drive_HS) based on high-side PM control signals (PWM_out_HS) output from digital core 110, and low-side driver 122 is configured to generate low-side PM drive signals (PWM_drive_LS) based on low-side PM control signals (PWM_out_LS) output from digital core 110. In the example of FIG. 1, logic circuit 112 is configured to monitor PM control signals (e.g., PMW_in_HS and PWM_in_LS) at pins 132, 134, and detect the one or more absences of either the high-side PM signals or the low-side PM signals based on monitoring the PM control signals (e.g., PMW_in_HS and PWM_in_LS) at pins 132, 134. In other words, the PM control signals being monitored in bridge driver circuit 102 comprise input signals from a processor to digital core 110. Therefore, a fault generated by logic 112 may pinpoint the signaling problem as likely coming from something prior to digital logic 110, such problems with the external processor, problems with pins 132, 134, or problems with the external wires that connect pins 132, 134 to the external processor.

Figure 2:
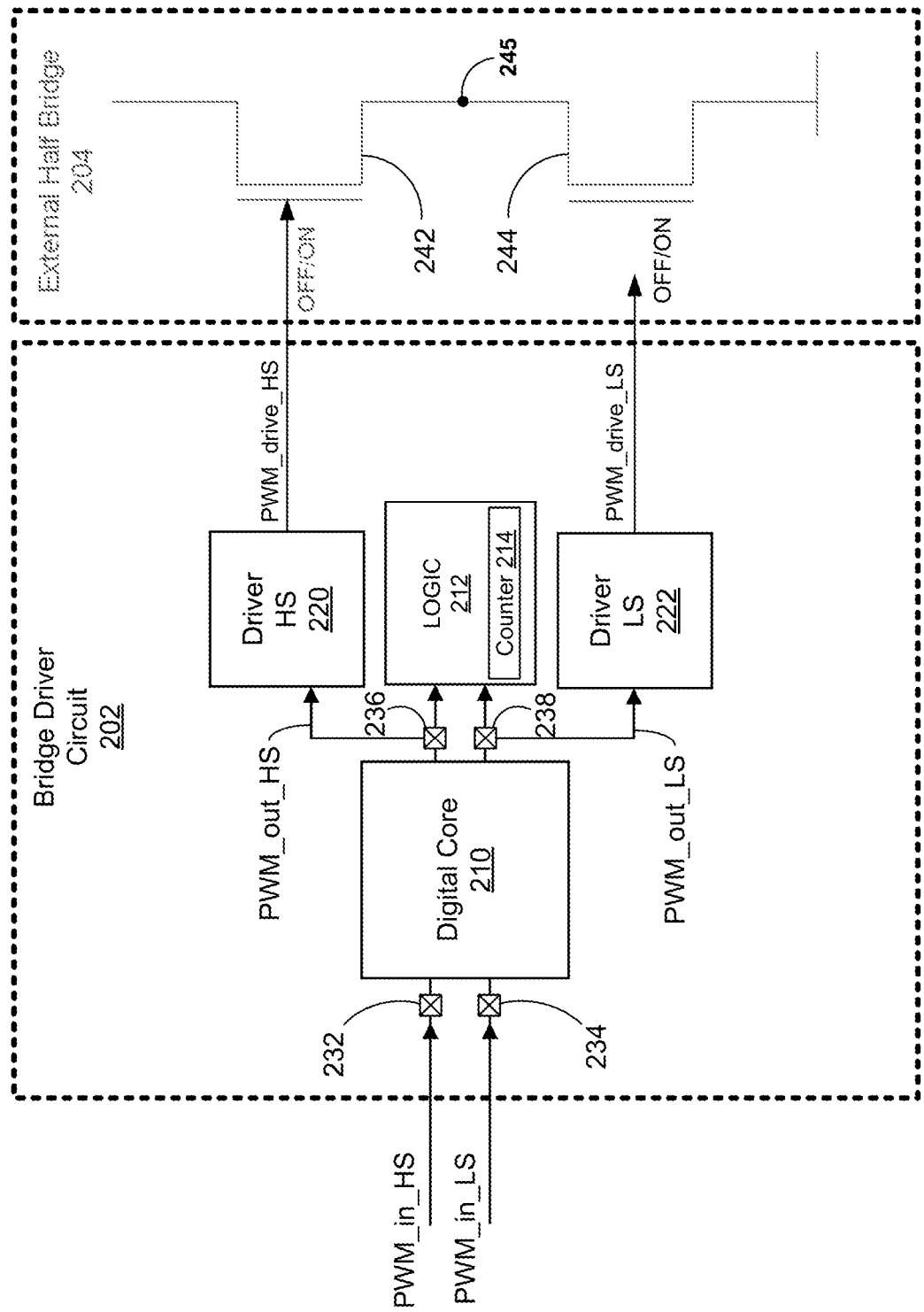
FIG. 2 is another block diagram showing a bridge driver circuit configured to control power switches of an external half bridge circuit.

FIG. 2 is a block diagram of an example bridge driver circuit 202 configured to control power switches 242, 244 of an external half bridge circuit 204. FIG. 2 is very similar to FIG. 1, in several respects. Power switches 242 and 244 are arranged in a half bridge configuration. High-side power switch 242 may be coupled to a first supply side (e.g., a supply voltage), and low-side power switch 244 may be coupled to a second supply side (e.g., a ground). A switch node 245 located between high-side power switch 242 and low-side power switch 244 may correspond to a control node for another device. For example, switch node 245 may be connected to a multi-phase electric motor and external half bridge circuit 204 may be configured to control a phase of the multi-phase electric motor.

Bridge driver circuit 202 includes a high-side driver 220 configured to drive a gate of high-side power switch 242 based on high-side pulse PM signals and bridge driver circuit 202 also include a low-side driver 222 configured to drive a gate of the low-side power switch 244 based on low-side PM signals. The high-side PM signals and the low-side PM signals are generally configured to turn high-side power switch 242 and low-side power switch 244 ON and OFF in a complementary fashion. In other words, in operating in complementary fashion, low-side power switch 244 is controlled ON when high-side power switch 242 is controlled OFF and high-side power switch 242 is controlled ON when low-side power switch 244 is controlled OFF.

Like the example shown in FIG. 1, bridge driver circuit 202 of FIG. 2 includes a digital core 210, which may comprise a digital interface with an external processor (not shown in FIG. 2). The external processor may be connected to bridge driver circuit 202 via input pins 232, 234 to digital core 210. High-side driver 220 and low-side driver 222 may be connected to digital core via pins 236, 238. Output pins (not shown in FIG. 2) may connect high-side driver 220 to high-side power switch 242, and may connect low-side driver 222 to low-side power switch 244.

High-side driver 220 and low-side driver 222 may be configured to generate PM drive signals (e.g., PWM_drive_HS and PWM_drive_LS) based on PM control signals (e.g., PWM_out_HS and PWM_out_LS). High-side driver 220 and low-side driver 222, for example, may comprise an amplifier, a DC/DC power converter, a regulator, and/or one or more power switches, which may generate PM drive signals at the level needed for controlling high-side power switch 242 and low-side power switch 244.

As with the example shown in FIG. 1, in FIG. 2, the PM signals generally refer to any of the PWM signals illustrated. Accordingly, the PM signals may take different forms (e.g., different levels or amplitudes) as the signals propagate through bridge driver circuit 202. In general, however, PM signals typically comprise square waves that define a high level (ON) and a low level (OFF). For examples, the PM signals may comprise PWM_in_HS and PWM_in_LS, PWM_out_HS and PWM_out_LS, or PWM_drive_HS and PWM_drive_LS. This disclosure describes the monitoring of PM signals to detect undesirable absences, and monitoring different types of PM signals may have different benefits.

In the example shown in FIG. 2, bridge driver circuit 202 includes a logic circuit 212 configured to monitor the high-side PM signals and the low-side PM signals. In this example, the monitored signals correspond to PMW_out_HS and PWM_out_LS, which are the signals output by digital core 210 at pins 236, 238. Logic circuit 212 is configured to detect one or more absences of either the high-side PM signals or the low-side PM signals and generate a fault signal (e.g., back to the external processor or to another controller) in response to detecting the one or more absences. For example, logic circuit 212 may be configured to communicate the fault signal to the processor.

Again, a single missing PM signal in either the high-side or the low-side may indicate a circuit problem or a signaling problem. However, generating a fault in response to a single missing PM signal may also result in false alarms or improper faults. Accordingly, in order to reduce possible false alarms, logic circuit 212 includes a counter 214 configured to count successive absences of either the high-side PM signals or the low-side PM signals, and logic circuit 212 may generate the fault signal in response to a count value of counter 214 reaching a count threshold. In this way, counter 214 operates as a filtering mechanism, which requires successive absent (albeit expected) PM signals before logic circuit 212 generates the fault signal. The count threshold, e.g., may be greater than 1 and less than 8. For motor control applications, a count threshold of 3 is typically sufficient to quickly identify problems while also limiting false alarms.

High-side driver 220 is configured to generate high-side PM drive signals (PWM_drive_HS) based on high-side PM control signals (PWM_out_HS) output from digital core 210, and low-side driver 222 is configured to generate low-side PM drive signals (PWM_drive_LS) based on low-side PM control signals (PWM_out_LS) output from digital core 210. Unlike FIG. 1, in the example of FIG. 2, logic circuit 212 configured to monitor different PM control signals (e.g., PMW_out_HS and PWM_out_LS) at pins 236, 238, and detect the one or more absences of either the high-side PM signals or the low-side PM signals based on monitoring the PM control signals (e.g., PMW_out_HS and PWM_out_LS) at pins 236, 238. In other words, the PM control signals being monitored in bridge driver circuit 202 comprise output signals from digital core 210. Therefore, a fault generated by logic 212 may generally indicate a signaling problem coming from digital core 210, problems with the external processor, problems with pins 232, 234, problems with pins 236, 238, or problems with the external wires that connect pins 232, 234 to the external processor. Accordingly, the example shown in FIG. 2 may identify more potential errors than the example of FIG. 1, while being slightly less precise in identifying the cause of the error.

It is also possible to combine the example of FIG. 1 with that of FIG. 2 to help pinpoint the location of any error. For example, if logic circuit 112 and logic circuit 212 were both used within bridge driver circuit 102 or 202, then a fault identified by logic circuit 212 and not identified by logic circuit 112 would indicate a problem with the digital core 110, 210, and a fault identified by logic circuit 212 and by logic circuit 112 would indicate likely problems with the external processor, problems with pins 132, 232, 134, 234 or problems with the external wires that connect pins 132, 232, 134, 234 to the external processor.

Figure 3:
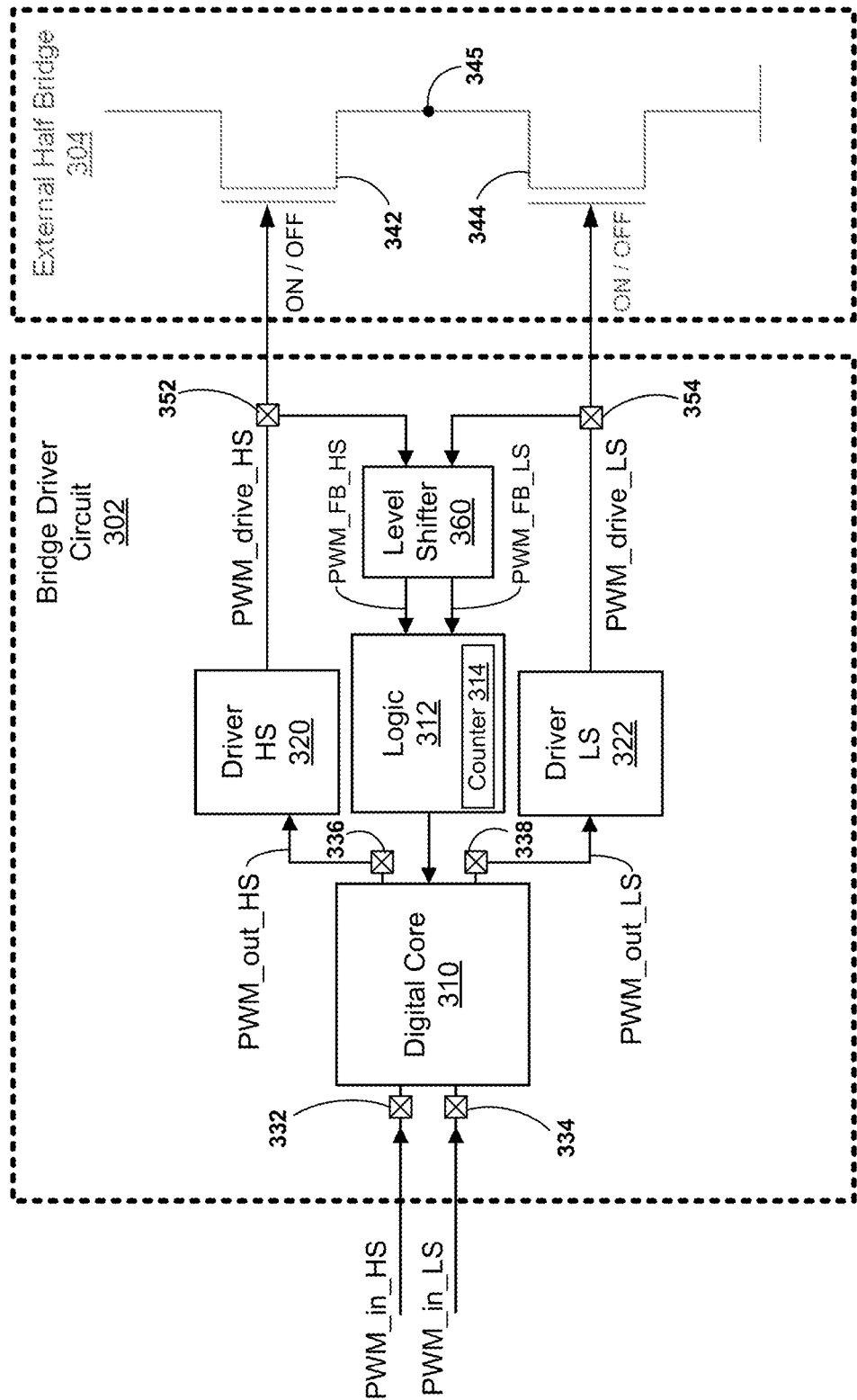
FIG. 3 is another block diagram showing a bridge driver circuit configured to control power switches of an external half bridge circuit.

FIG. 3 is another block diagram of an example bridge driver circuit 302 configured to control power switches 342, 344 of an external half bridge circuit 304. FIG. 3 is very similar to FIGS. 1 and 2, in several respects. Power switches 342 and 344 are arranged in a half bridge configuration. High-side power switch 342 may be coupled to a first supply side (e.g., a supply voltage), and low-side power switch 344 may be coupled to a second supply side (e.g., a ground). Of course, different supplies could also be used on the high-side or the low-side (e.g., a non-grounded or floating reference voltage) in the examples of FIG. 1, 2, or 3. Like FIG. 1 and FIG. 2, in FIG. 3, a switch node 345 is located between high-side power switch 342 and low-side power switch 344 may correspond to a control node for another device. For example, switch node 345 may be connected to a multi-phase electric motor and external half bridge circuit 304 may be configured to control a phase of the multi-phase electric motor.

As with other examples, in FIG. 3, bridge driver circuit 302 includes a high-side driver 320 configured to drive a gate of high-side power switch 342 based on high-side pulse PM signals and bridge driver circuit 302 also include a low-side driver 322 configured to drive a gate of the low-side power switch 344 based on low-side PM signals. The high-side PM signals and the low-side PM signals are generally configured to turn high-side power switch 342 and low-side power switch 344 ON and OFF in a complementary fashion. In other words, in operating in complementary fashion, low-side power switch 344 is controlled ON when high-side power switch 342 is controlled OFF and high-side power switch 342 is controlled ON when low-side power switch 344 is controlled OFF.

Like the example shown in FIGS. 1 and 2, bridge driver circuit 302 of FIG. 3 includes a digital core 310, which may comprise a digital interface with an external processor (not shown in FIG. 3). The external processor may be connected to bridge driver circuit 302 via input pins 332, 334 to digital core 310. High-side driver 320 and low-side driver 322 may be connected to digital core via pins 336, 338. Output pins 352, 353 (i.e., outputs of bridge driver circuit 302) may connect high-side driver 320 to high-side power switch 342 and may connect low-side driver 322 to low-side power switch 344.

High-side driver 320 and low-side driver 322 may be configured to generate PM drive signals (e.g., PWM_drive_HS and PWM_drive_LS) based on PM control signals (e.g., PWM_out_HS and PWM_out_LS). High-side driver 320 and low-side driver 322, for example, may comprise an amplifier, a DC/DC power converter, a regulator, and/or one or more power switches, which may generate PM drive signals at the level needed for controlling high-side power switch 342 and low-side power switch 344.

As with the examples shown in FIGS. 1 and 2, in FIG. 3, the PM signals generally refer to any of the PWM signals illustrated. Accordingly, the PM signals may take different forms (e.g., different levels or amplitudes) as the signals propagate through bridge driver circuit 302. In general, however, PM signals typically comprise square waves that define a high level (ON) and a low level (OFF). For examples, the PM signals may comprise PWM_in_HS and PWM_in_LS, PWM_out_HS and PWM_out_LS, or PWM_drive_HS and PWM_drive_LS. This disclosure describes the monitoring of PM signals to detect undesirable absences, and monitoring different types of PM signals may have different benefits.

In the example shown in FIG. 3, bridge driver circuit 302 includes a logic circuit 312 configured to monitor the high-side PM signals and the low-side PM signals. In this example, bridge driver circuit 302 further comprises a level shifter circuit 360 which is configured to level shifted versions of PWM_drive_HS and PWM_drive_LS, which may comprise feedback signals that have lower amplitudes than the PM drive signals. In this case, the monitored signals correspond to PMW_FB_HS and PWM_FB_LS, which are level shifted versions of the high-side PM drive signals and the low-side PM drive signals. As with other examples, logic circuit 312 is configured to detect one or more absences of either the high-side PM signals or the low-side PM signals and generate a fault signal (e.g., back to the external processor or to another controller) in response to detecting the one or more absences. For example, logic circuit 312 may be configured to communicate the fault signal to the processor.

As with other examples, with the example shown in FIG. 3, a single missing PM signal in either the high-side or the low-side may indicate a circuit problem or a signaling problem. However, generating a fault in response to a single missing PM signal may also result in false alarms or improper faults. Accordingly, in order to reduce possible false alarms, logic circuit 312 includes a counter 314 configured to count successive absences of either the high-side PM signals or the low-side PM signals, and logic circuit 312 may generate the fault signal in response to a count value of counter 314 reaching a count threshold. In this way, counter 314 operates as a filtering mechanism, which requires successive absent (albeit expected) PM signals before logic circuit 312 generates the fault signal. The count threshold, e.g., may be greater than 1 and less than 8. Again, as indicated above, for motor control applications, a count threshold of 3 is typically sufficient to quickly identify problems while also limiting false alarms.

High-side driver 320 is configured to generate high-side PM drive signals (PWM_drive_HS) based on high-side PM control signals (PWM_out_HS) output from digital core 310, and low-side driver 322 is configured to generate low-side PM drive signals (PWM_drive_LS) based on low-side PM control signals (PWM_out_LS) output from digital core 310. Unlike FIGS. 1 and 2, in the example of FIG. 3, logic circuit 312 configured to monitor different PM signals (e.g., level shifted versions of the PM drive signals shown as PMW_FB_HS and PWM_FB_LS) at pins 352, 354, and detect the one or more absences of either the high-side PM signals or the low-side PM signals based on monitoring the level shifted PM drove signals (e.g., PMW_FB_HS and PWM_FB_LS) at pins 352, 354. In other words, the PM signals being monitored in bridge driver circuit 302 level shifted versions of the drive signals being sent from bridge driver circuit 302 to external half bridge 304. Therefore, a fault generated by logic 312 may indicate a problem coming from drivers 320, 322, a problem with output pins 352, 354, a problem with digital core 310, problems with the external processor, problems with pins 332, 334, problems with pins 336, 338, or problems with the external wires that connect pins 332, 334 to the external processor. Accordingly, the example shown in FIG. 3 may identify even more potential errors than the examples of FIGS. 1 and 2, while being slightly less precise in identifying the cause of the error.

It is also possible to combine the examples of FIGS. 1, 2, and 3, to help pinpoint the location of any error. For example, if logic circuits 112, 212, and 312 were all used within bridge driver circuit 102, 202, 302, then a fault identified by one logic circuit and not identified by another logic circuit can help pinpoint the location of the problem within bridge driver circuit 102, 202, 302, whereas a fault identified by all of logic circuits 112, 212, 312 (if used in combination) would indicate a likely problem outside of the bridge driver circuit 102, 202, 302.

Figure 4:
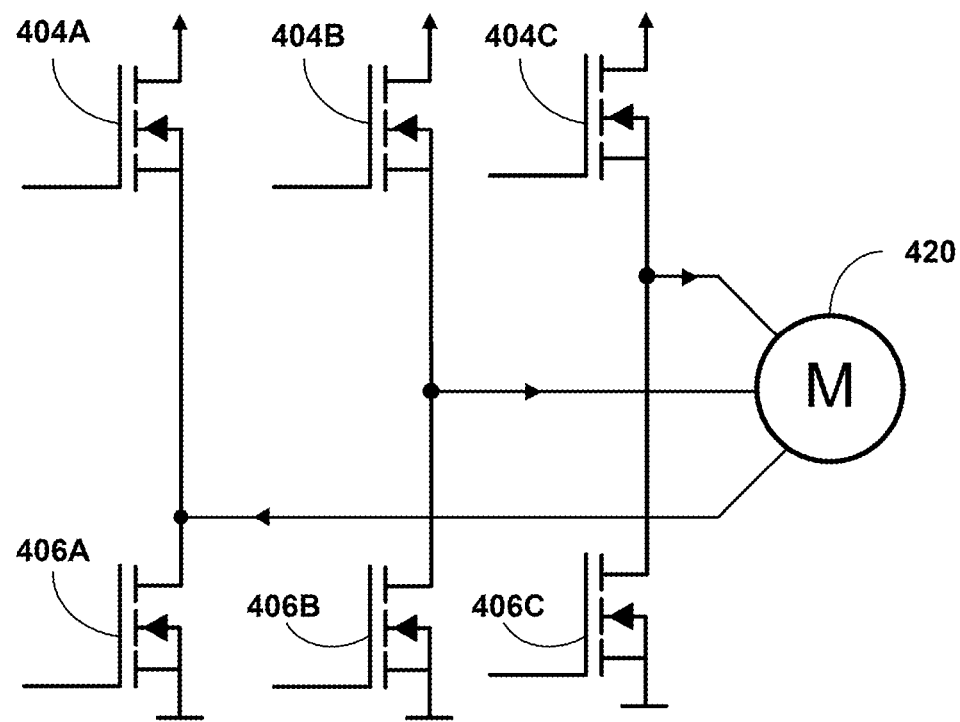
FIG. 4 is a circuit diagram showing three half bridges arranged to control operation of a three-phase electric motor.

FIG. 4 is a circuit diagram showing three half bridges (e.g., three half bridge circuits) arranged to control operation of an electric motor 420. Power switches 404A and 406A define a first half bridge circuit, power switches 404B and 406B define a second half bridge circuit, and power switches 404C and 406C define a third half bridge circuit. Each half bridge circuit shown in FIG. 4 may be similar to half bridge circuits 104, 204, 304 of FIGS. 1-3, and each half bridge circuit shown in FIG. 4 may be controlled by a half bridge driver circuit similar to external half bridge driver circuit 102, 202 or 302 of FIGS. 1-3. Separate bridge driver circuits (similar to bridge driver circuits 102, 202, 302) could also be used for each of the power switches shown in FIG. 3.

Accordingly, this disclosure contemplates a plurality of high-side drivers 120, 220, 320 and a plurality of low-side drivers 122, 222, 322 configured to control a plurality of half bridge circuits such as shown in FIG. 4, wherein the plurality of half bridge circuits is configured to control a multi-phase electric motor 420. In this case, for each of the plurality of half bridge circuits, a respective bridge driver circuit 102, 202, 302 includes a respective logic circuit 112, 212, 312 configured to detect one or more absences of either the high-side PM signals or the low-side PM signals for a respective one of the plurality of half bridges and generate the fault signal in response to detecting the one or more absences. Counters 1154, 214, 314 can improve the fault detection, with the respective logic circuit 112, 212, 312 defining a count threshold where successive absences of expected PM signals indicates the fault.

In general, a circuit or system for driving motors often uses half bridge circuits. The half bridge circuits may include two MOSFETs that are driven by a bridge driver circuit. Bridge Driver ICs used in brushless direct current (BLDC) motor control applications typically have six PWM control inputs (two inputs per half bridge) externally controlled by a processor (e.g., a micro-controller).

In circuits or systems that are used in safety critical environments, the MOSFETs control capabilities of the circuit may need to be checked for proper operation. The microcontroller may control the PWM inputs (e.g., which may comprise turn ON requests, and turn OFF requests). This spins and controls the motor. The control signals for one half bridge are typically set "high" and "low" alternatingly.

In the case where a PWM control input is not propagating correctly through the bridge driver circuit (e.g., due to open pin event, missing bondwires, internal IC single point faults, or other problems), the motor control scheme can be strongly affected (e.g., causing a reduction or even loss of motor torque) while no error is reported if the circuit interprets the event as an intended micro-controller request).

The circuits and techniques described herein can provide a technical solution for detecting and reporting a PWM control scheme that does not alternate the high-side and low-side driver properly in every PWM cycle.

In some BLDC motor control systems, a processor or microcontroller may be responsible to detect an unintended OFF situation by a plausibility check of motor current and phase feedback function. With this approach, however, problems can only be detected by external safety measures which imply increased complexity and limitations at system level since an unintended motor torque reduction is difficult to assess in real time as related to a fault in the PWM signal propagation path. Thus, a drawback of this approach is that it cannot be applied reliability in any BLDC motor control systems. If a single current sensing is used for all three motor phases, the plausibility check cannot be performed since there is no redundancy at micro-controller level to use as detection mechanism of unintended OFF event due to loss of a PWM control signal.

The proposed technical solutions described herein can monitor the PWM control scheme for each half bridge driver circuit. In a BLDC motor control circuits and systems, each half bridge is expected to receive a PWM control pattern which ensures alternation of high-side and low-side MOSFET ON phases at each PWM period.

The bridge driver circuits described herein may implement digital logic that checks strictly for the presence of the alternation on two (e.g., high-side and low-side) pins of the PWM control of each half bridge. In case the ON request of one MOSFET in the half bridge is detected multiple times without any complementary ON request, an error can be reported via an SPI register or via a device error pin if such pin is available to the micro-controller.

Various advantages of this approach may include:

The PWM correct functionality is monitored continuously during operation, no self-test or plausibility checks are needed The digital logic used to detect the PWM alternation presence does not restrict in any way the motor control scheme This approach offers full flexibility at system level to adjust the number of consecutive PWM ON detections on one MOSFET while the complementary ON request is missing.

Thus, the described circuits and techniques provide an easy and effective mechanism to detect and report a stuck OFF condition at a PWM input pin. By having implemented the monitoring in the bridge driver circuit, it may also be possible to reduce external processing load which would otherwise be required in case of external plausibility checks.

Figure 5:
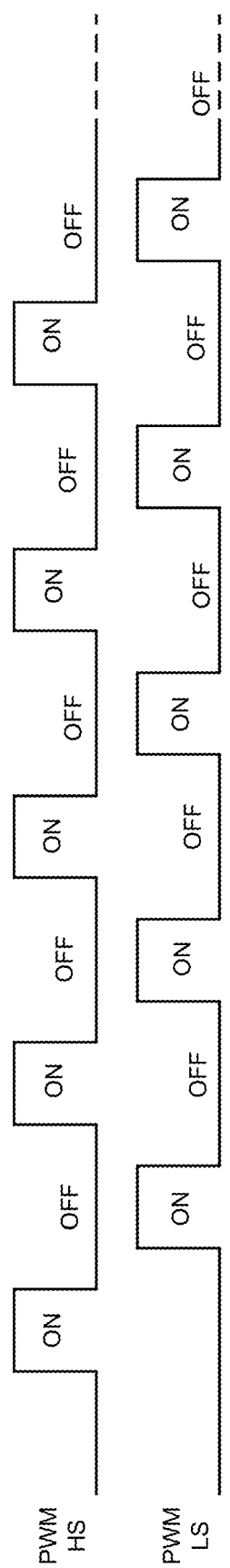
FIG. 5 is a timing diagram showing pulse modulation (PM) signals associated with controlling high-side and low-side power switches of an external half bridge circuit.

FIG. 5 is a timing diagram showing PM signals associated with controlling high-side and low-side power switches of an external half bridge circuit. The PM signals illustrated in FIG. 5 are labeled as PWM HS (for the high-side transistor) and PWM LS (for the low-side transistor). PWM HS and PWM LS may correspond to any of the PWM signals discussed in FIGS. 1-3. FIG. 5 generally shows normal operation of the PM signals, whereby the PWM HS and PWM LS define alternating and complementary ON and OFF states.

Figure 6:
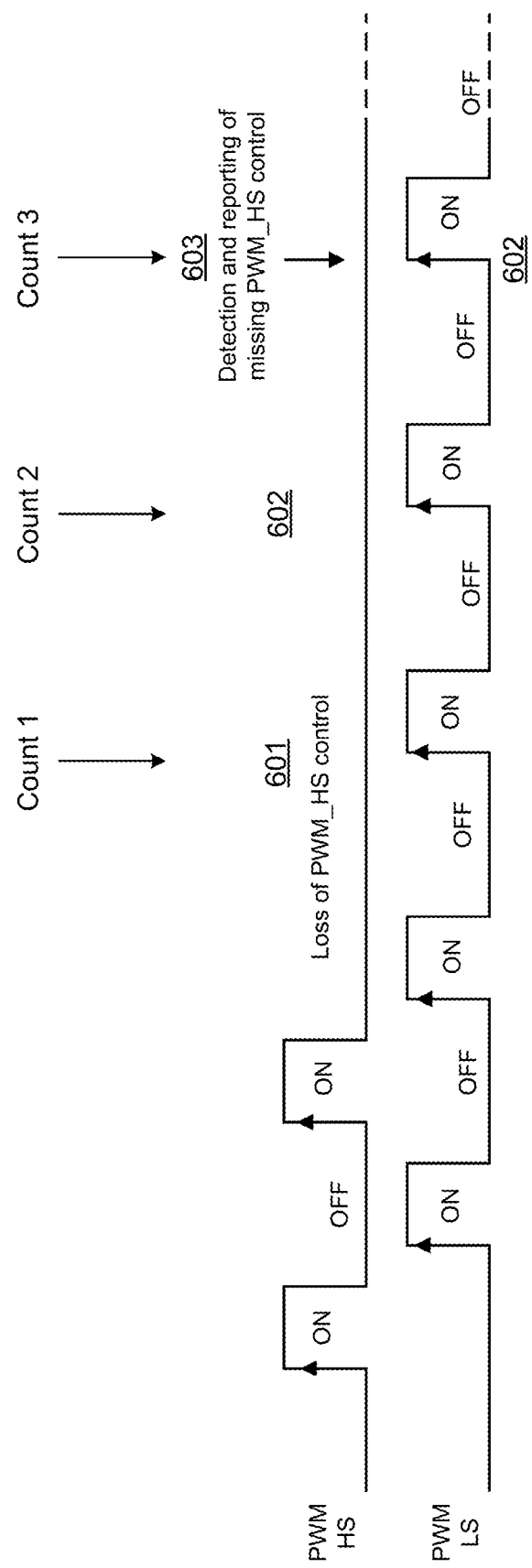
FIG. 6 is a timing diagram showing PM signals and loss of signals on a high-side.

FIG. 6 is a timing diagram showing PM signals and loss of signals on a high-side. The PM signals in FIG. 6 are similar to those of FIG. 5, but in FIG. 6 there is an absence of the PM signal at location 601, 602, and 603. A logic circuit 112, 212, 312 may be configured to monitor the PM signals shown in FIG. 6 and detect and count any absences of expected PM signals. For example, a counter 114, 214, 314 may count absences of the PM signal at locations 601, 602, and 603, e.g., incrementing a count value to 1, 2, 3 as shown at locations 601, 602, and 603 respectively. Logic circuit 112, 212, 312 may react to the count value reaching a threshold, e.g., counter=3 at location 603. When counter 114, 214, 314 reaches that threshold (e.g., counter=3), logic circuit 112, 212, 312 may issue a fault back to a control processor, which may take appropriate action, such as disabling the bridge driver 102, 202, 302, or operating the bridge driver 102, 202, 302 in a safe mode. The safe mode for motor control may comprise lower power mode than used in normal operation and may facility a so-called "limp home" operation of an electric vehicle. The electric motor may have reduced torque and horsepower in the "limp home" mode than it does in the normal operating mode of the electric vehicle.

Figure 7:
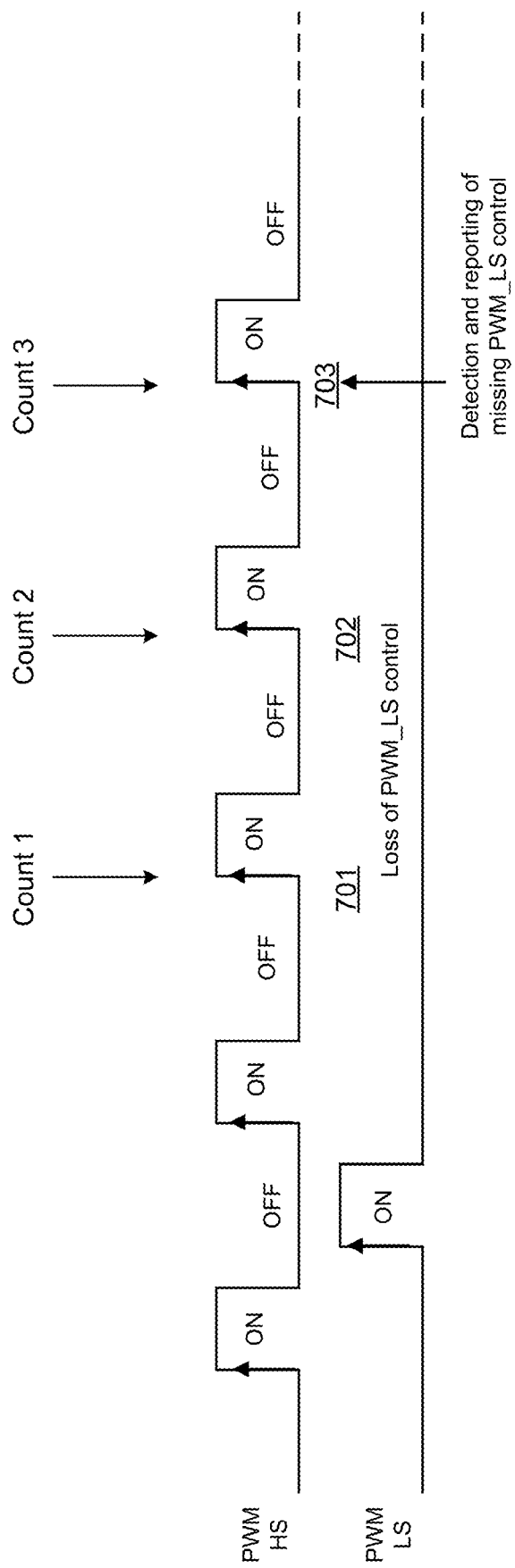
FIG. 7 is a timing diagram showing PM signals and loss of signals on a low-side.

FIG. 7 is a timing diagram that is similar to FIG. 6 in many respects. Whereas FIG. 6 shows missing (yet expected) PM signals on the high-side, FIG. 7 shows missing (yet expected) PM signals on the low-side. A logic circuit 112, 212, 312 may be configured to monitor the PM signals shown in FIG. 7 and detect and count any absences of expected PM signals. For example, consistent with FIG. 7, a counter 114, 214, 314 may count absences of the PM signal at locations 701, 702, and 703, e.g., incrementing a count value to 1, 2, 3 as shown at locations 701, 702, and 703 respectively. Logic circuit 712, 712, 712 may react to the count value reaching a threshold, e.g., counter=3 at location 703. When counter 114, 214, 314 reaches that threshold (e.g., counter=3), logic circuit 112, 212, 312 may issue a fault back to a control processor, which may take appropriate action, such as disabling the bridge driver 102, 202, 302, or operating the bridge driver 102, 202, 302 in a safe mode. Again, the safe mode for motor control may comprise lower power mode than used in normal operation and may facility a so-called "limp home" operation of an electric vehicle. The electric motor may have reduced torque and horsepower in the "limp home" mode than it does in the normal operating mode of the electric vehicle.

FIGS. 5-7 generally depict scenarios in which a high logic level implies a corresponding MOSFET ON request. The PWM control scheme for a half bridge of MOSFET is applied correctly in FIG. 5. In contrast, the PWM control signals may be forced in either low-side (LS) or High-side (HS), whereby a particular MOSFET PWM input is stuck OFF in FIGS. 6 and 7, implying a problem.

With the proposed implementation described herein, a digital logic is may be for each half bridge (for monitoring PWM_HS, PWM_LS pin pairs) in which the following control scheme is applied on the synchronized internal PWM signals:

A PWM low-high transition (no matter HS or LS) enables a state machine in logic 112, 212, 312.

For the next PWM low-high transition:
if it is on the complementary PWM input restarts the state machine
if it is on the same PWM input as previous transition then an error counter 114, 214, 314 is started a PWM low-high transition detection on complementary PWM input resets error counter 114, 214, 314 if the error count reaches a configured value or consecutive PWM ON requests on the same MOSFET, the PWM stuck of the complementary PWM input is reported (e.g., to processor 801) and the system reacts (e.g., such as by reporting the error, switching OFF the respective half bridge, modifying system operation to operate in in safe state, or possibly switching OFF all MOSFETs).

Figure 8:
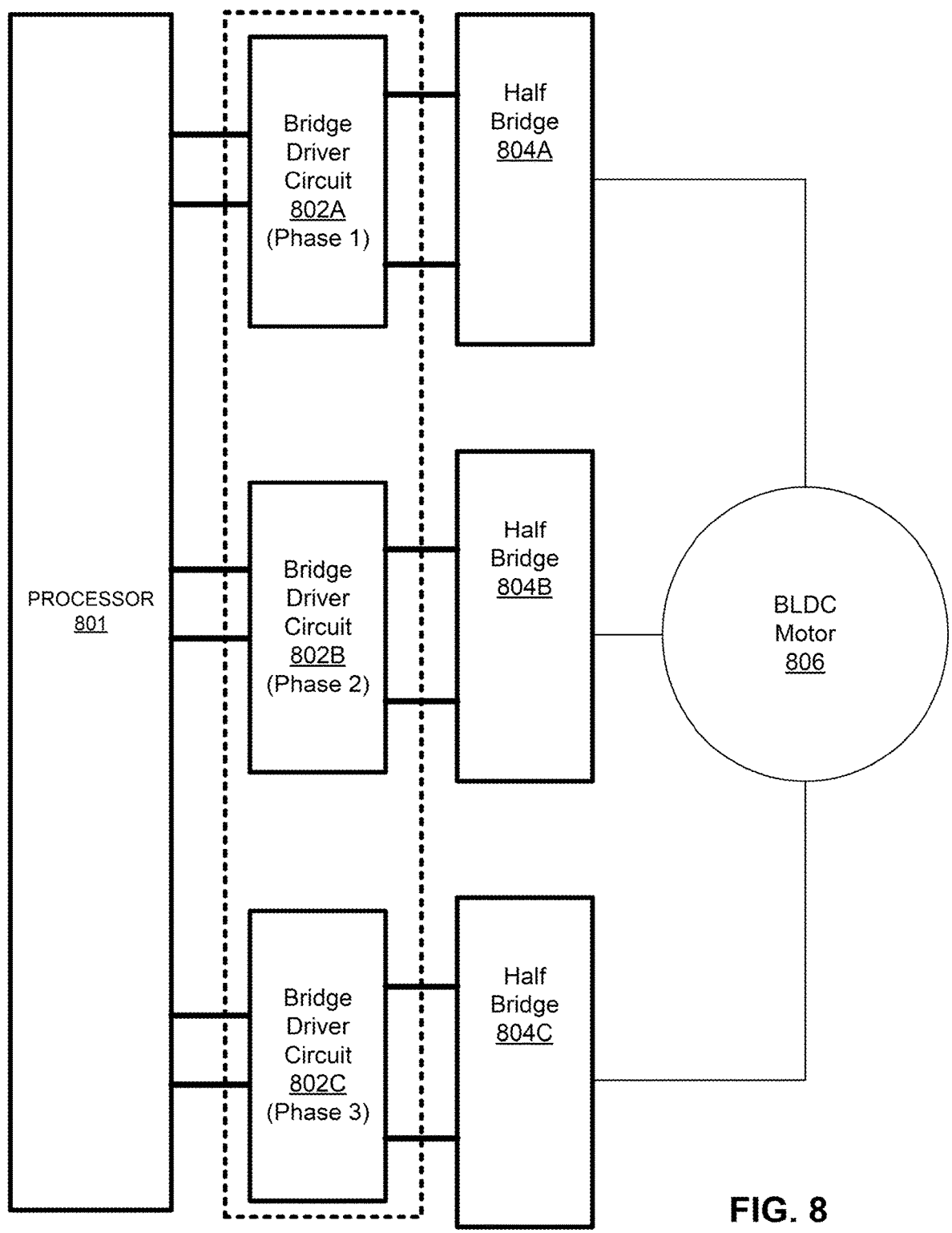
FIG. 8 is a system diagram consistent with one or more examples of this disclosure.

FIG. 8 is a system diagram consistent with one or more examples of this disclosure. A processor 801 generates PM control signals and delivers the PM control signals to bride driver circuits 802A, 802B, 802C. Bridge driver circuits generate PM drive signals based on the PM control signals and drive three different half bridge circuits 804A, 804B, 804C in order to control three phases of a brushless direct current (BLDC) motor 806. BLDC motor 806 may correspond to any BLDC motor application, and the motor of an electric vehicle is merely one example application.

Bridge driver circuits 802A, 802B, 802C may each correspond to bridge driver circuits 102, 202, or 302. If a fault is detected by logic circuit 112, 212, 312 for any of bridge driver circuits 802A, 802B, 802C, that respective bridge driver circuit may issue a fault signal back to processor 801, and processor may take the appropriate actions to ensure safe operation of the system, such as by disabling the system, disabling the respective bridge driver circuit that issued the fault, or possibly by implementing a different "safe" and "lower power" operation mode for some or all of bridge driver circuits 802A, 802B, 802C.

Figure 9:
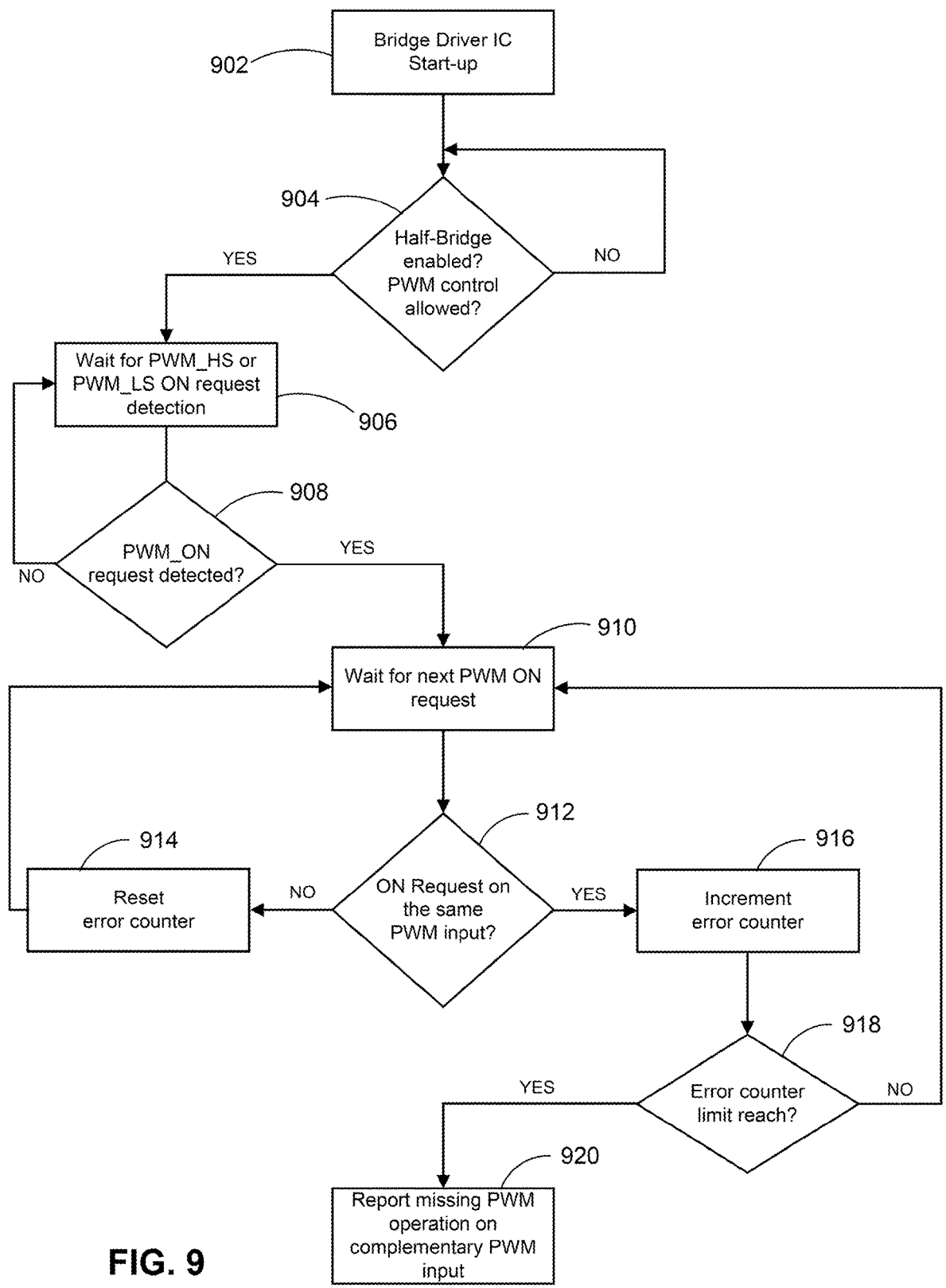
FIGS. 9 and 10 are flow diagrams showing techniques according to this disclosure.
Figure 10:
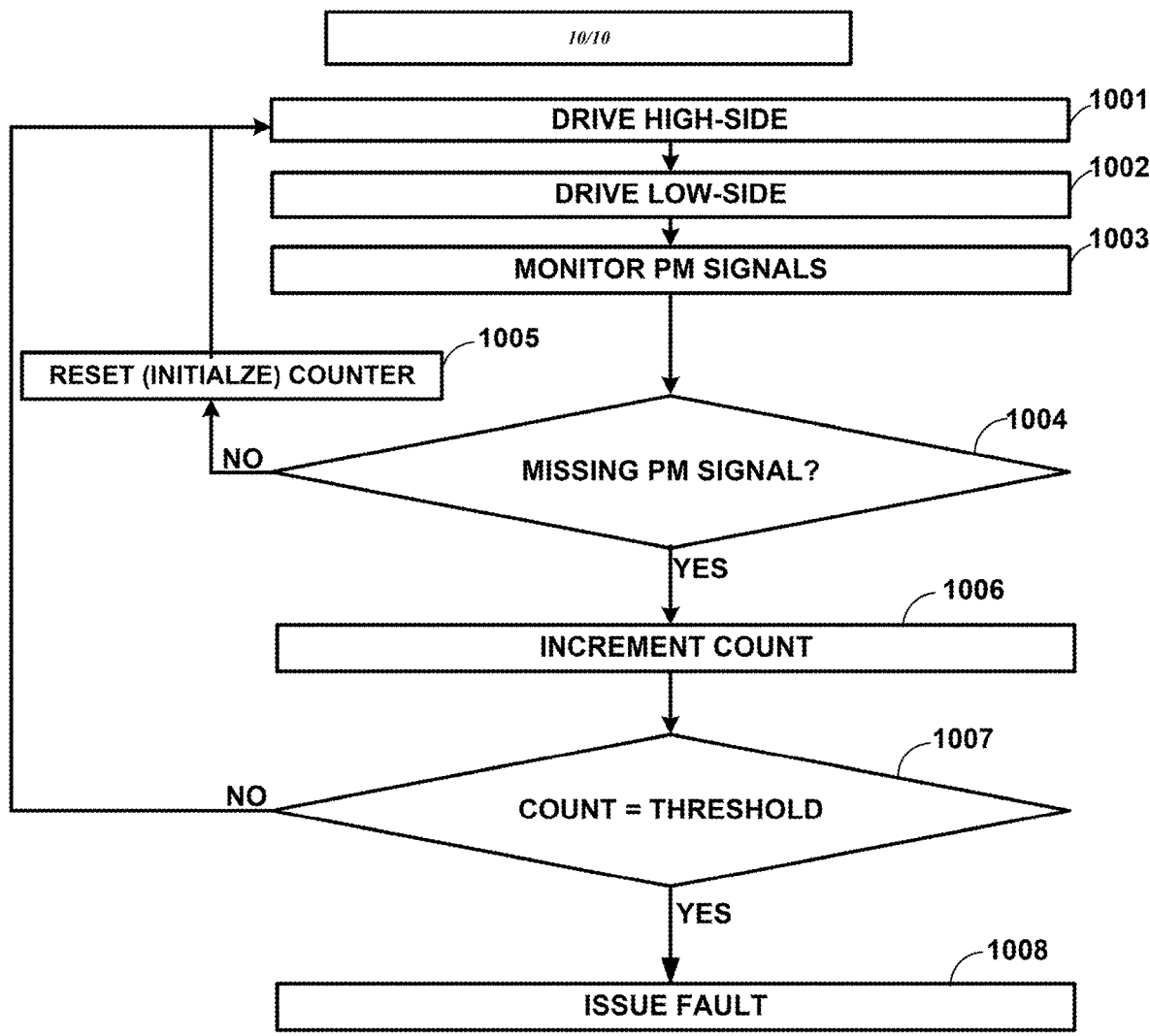

FIGS. 9 and 10 are flow diagrams showing techniques according to this disclosure. FIG. 9 may also be viewed as a state diagram showing a control scheme performed by a bridge driver circuit consistent with this disclosure.

In the example shown in FIG. 9, after start-up of a bridge driver circuit 102, 202, 302 (902), a logic circuit 112, 212, 312 may determine if a half bridge circuit 104, 204, 304 is enabled such that PWM control is allowed (904). If so (yes branch of 904), logic circuit 112, 212, 312 may wait to detect PWM_HS or PWM-LS ON requests (906). In FIG. 9, the PWM_HS and PWM_LS ON requests may correspond to any of the PM signals described herein. Upon detecting a PWM_ON request (yes branch of 908), logic circuit 112, 212, 312 may then wait for a next PWM_ON request (910). If the next ON request is from a different PWM input, e.g., a different high side or low side (no branch of 912), counter 114, 214, 314 is reset (914). However, if the next ON request is from the same PWM input (yes branch of 912), counter 114, 214, 314 is incremented. This process continues, as long as counter 114, 214, 314 has not reached its limit or threshold (no branch of 918). If counter 114, 214, 314 reaches its limit or threshold (yes branch of 918), this means that a particular (e.g., pre-defined) number of successively PM signals are absent (yet expected). In this case, logic circuit 112, 212, 312 may report the missing PMW operations (920), e.g., by sending a fault signal back to processor 801.

FIG. 10 is another flow diagram consistent with this disclosure. As shown in FIG. 10, a bridge driver circuit 102, 202, 302 drives a high-side transistor 142, 242, 342 (1001) and drives a low-side transistor 144, 244, 344 (1002) in a complementary fashion. When doing so, logic circuit 112, 212, 312 monitors the PM signals (1003) to check for missing or absent signals. If there are no missing PM signals (no branch of 1004), counter 114, 214, 314 is reset (1005). However, upon detecting a missing PM signal on either the high side or low side, logic circuit 112, 212, 312 increments a count value (1006). Normal control of continues as long as counter 114, 214, 314 has not reached its count threshold ("no" branch of 1007). Once counter 114, 214, 314 has not reached its count threshold ("yes" branch of 1107) indicating a pre-defined number of successively absent PM signals on either the high side or the low side, logic circuit 112, 212, 312 may issue a fault signal (1008) back to processor 801. Thus, consistent with FIGS. 9 and 10, logic circuit 112, 212, 312 maintains a count value indicative of successive absences of either the high-side PM signals or the low-side PM signals and generates the fault signal in response to the count value reaching a count threshold.

The circuits and techniques described herein may be part of a safety mechanism configured to ensure safe operation of an electrical motor and other circuits attached to the electrical motor. The described techniques may improve fault detection in a motor control system. Indeed, the techniques may significantly reduce rates of package failures in the safety analysis at circuit and system levels.

By using an internal PWM monitoring state machine for each half bridge:
  bridge driver circuits may be capable of detecting package faults (open pins or missing bond wires) or system faults (fault events on PCB traces or micro-controller IOs) which cannot otherwise be detected or differentiated by the typical external safety mechanisms (plausibility checks) at micro-controller or processor level;
  the micro-controller or processor may offload this more reliable detection, possibly eliminating or reducing the need for plausibility checks at the system level;
  at system level the missing or stuck PWM scenarios can be clearly identified by direct monitoring mechanism instead of indirect measurements of motor phase pins (phase feedback monitoring) or drain-source monitoring of MOSFETs or periodic plausibility checks which imply breaking the motor intended operation;
  the PWM monitoring may be performed at each PWM cycle, thus defining a continuous checking and monitoring scheme.

The techniques described in this disclosure may be implemented, at least in part, in circuitry, hardware, software, firmware or any combination thereof. For example, various aspects of the described techniques may be implemented within one or more logical elements, processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

It may also be possible for one or more aspects of this disclosure to be performed in software, in which case those aspects of the techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, or other computer readable media.

The following clauses may illustrate one or more aspects of the disclosure.

Clause 1—A driver circuit configured to control a high-side power switch and a low-side power switch arranged in a half bridge configuration, the driver circuit comprising: a high-side driver configured to drive a gate of the high-side power switch based on high-side PM signals; a low-side driver configured to drive a gate of the low-side power switch based on low-side PM signals; and a logic circuit configured to monitor the high-side PM signals and the low-side PM signals, wherein the high-side PM signals and the low-side PM signals are configured to turn the high-side power switch and the low-side power switch ON and OFF in a complementary fashion, and wherein the logic circuit is configured to detect one or more absences of either the high-side PM signals or the low-side PM signals and generate a fault signal in response to detecting the one or more absences.

Clause 2—The driver circuit of clause 1, wherein the logic circuit is configured to communicate the fault signal to a processor.

Clause 3—The driver circuit of clause 1 or 2, wherein the high-side driver is configured to generate high-side PM drive signals based on high-side PM control signals output from a digital core, wherein the low-side driver is configured to generate low-side PM drive signals based on low-side PM control signals output from the digital core, and wherein the logic circuit configured to monitor PM control signals and detect the one or more absences of either the high-side PM signals or the low-side PM signals based on monitoring the PM control signals.

Clause 4—The driver circuit of clause 3, wherein the PM control signals comprise input signals from a processor to the digital core.

Clause 5—The driver circuit of clause 3, wherein the PM control signals comprise the high-side PM control signals output from the digital core to the high-side driver and the low-side PM control signals output from the digital core to the low-side driver.

Clause 6—The driver circuit of clause 1 or 2, further comprising a level shifter circuit, wherein the high-side driver is configured to generate high-side PM drive signals based on high-side PM control signals output from a digital core, wherein the low-side driver is configured to generate low-side PM drive signals based on low-side PM control signals output from the digital core, wherein the level shifter circuit is configured to generate level shifted versions of the high-side PM drive signals and the low-side PM drive signals, and wherein the logic circuit configured to monitor the level shifted versions of the high-side PM drive signals and the low-side PM drive signals and detect the one or more absences of either the high-side PM signals or the low-side PM signals based on monitoring the level shifted versions of the high-side PM drive signals and the low-side PM drive signals.

Clause 7—The driver circuit of any of clauses 1-6, wherein the logic includes a counter configured to count successive absences of either the high-side PM signals or the low-side PM signals and generate the fault signal in response to a count value of the counter reaching a count threshold.

Clause 8—The driver circuit of clause 7, wherein the count threshold is greater than 1 and less than 8.

Clause 9—The driver circuit of clause 8, wherein the count threshold is 3.

Clause 10—The driver circuit of any of clauses 1-9, further comprising a plurality of high-side drivers and a plurality of low-side drivers configured to control a plurality of half bridges.

Clause 11—The driver circuit of clause 10, wherein the plurality of half bridges is configured to control a multi-phase electric motor.

Clause 12—The driver circuit of clause 10 or 11, wherein for each of the plurality of half bridges, the driver circuit includes a respective logic circuit configured to detect one or more absences of either the high-side PM signals or the low-side PM signals for a respective one of the plurality of half bridges and generate the fault signal in response to detecting the one or more absences.

Clause 13—A method of controlling a high-side power switch and a low-side power switch arranged in a half bridge configuration, the method comprising: driving a gate of the high-side power switch based on high-side PM signals; driving a gate of the low-side power switch based on low-side PM signals; and monitoring the high-side PM signals and the low-side PM signals, wherein the high-side PM signals and the low-side PM signals are configured to turn the high-side power switch and the low-side power switch ON and OFF in a complementary fashion, and wherein monitoring includes: detecting one or more absences of either the high-side PM signals or the low-side PM signals; and generating a fault signal in response to detecting the one or more absences.

Clause 14—The method of clause 13, further comprising: communicating the fault signal to a processor.

Clause 15—The method of clause 13 or 14, wherein a high-side driver is configured to generate high-side PM drive signals based on high-side PM control signals output from a digital core, wherein a low-side driver is configured to generate low-side PM drive signals based on low-side PM control signals output from the digital core, and wherein monitoring the high-side PM signals and the low-side PM signals includes monitoring PM control signals and detecting the one or more absences of either the high-side PM signals or the low-side PM signals based on monitoring the PM control signals.

Clause 16—The method of claim 13 or 14, wherein a high-side driver is configured to generate high-side PM drive signals based on high-side PM control signals output from a digital core, wherein a low-side driver is configured to generate low-side PM drive signals based on low-side PM control signals output from the digital core, wherein a level shifter circuit is configured to generate level shifted versions of the high-side PM drive signals and the low-side PM drive signals, and wherein monitoring the high-side PM signals and the low-side PM signals includes monitoring the level shifted versions of the high-side PM drive signals and the low-side PM drive signals and detecting the one or more absences of either the high-side PM signals or the low-side PM signals based on monitoring the level shifted versions of the high-side PM drive signals and the low-side PM drive signals.

Clause 17—The method of any of clauses 13-16, further comprising: maintaining a count value indicative of successive absences of either the high-side PM signals or the low-side PM signals; and generating the fault signal in response to the count value reaching a count threshold.

Clause 18—The method of clause 17, wherein the count threshold is greater than 1 and less than 6.

Clause 19—The method of any of clauses 13-18, wherein the method comprises a method of controlling a plurality of high-side drivers and a plurality of low-side drivers configured to control a plurality of half bridges, wherein the plurality of half bridges is configured to control a multi-phase electric motor.

Clause 20—The method of clause 19, further comprising, for each of the plurality of half bridges, detecting one or more absences of either the high-side PM signals or the low-side PM signals for a respective one of the plurality of half bridges and generating the fault signal in response to detecting the one or more absences.

Clause 21—A system comprising: a three-phase electric motor; a plurality of half bridge circuits each comprising a high-side power switch and a low-side power switch arranged in a half bridge configuration, wherein each of the half bridge circuits controls a respective phase of the three-phase electric motor; for each of the plurality of half bridge circuits, a respective driver circuit configured to control the high-side power switch and the low-side power switch; and a processor configured to generate control signals for each of the respective driver circuits, wherein: each of the respective driver circuits includes: a logic circuit configured to monitor high-side pulse modulation (PM) signals and low-side PM signals, wherein the high-side PM signals and the low-side PM signals are configured to turn the high-side power switch and the low-side power switch ON and OFF in a complementary fashion, and wherein the logic circuit is configured to detect one or more absences of either the high-side PM signals or the low-side PM signals and generate a fault signal in response to detecting the one or more absences.

Clause 22—The system of clause 21, wherein for each of the respective driver circuits: a high-side driver is configured to generate high-side PM drive signals based on high-side PM control signals output from a digital core that is connected to the processor, a low-side driver is configured to generate low-side PM drive signals based on low-side PM control signals output from the digital core that is connected to the processor, and the logic circuit configured to monitor PM control signals and detect the one or more absences either the high-side PM signals or the low-side PM signals based on monitoring the PM control signals.

Clause 23—The system of clause 21, wherein each of the respective driver circuits includes a level shifter circuit, wherein for each of the respective driver circuits: a high-side driver is configured to generate high-side PM drive signals based on high-side PM control signals output from a digital core that is connected to the processor, a low-side driver is configured to generate low-side PM drive signals based on low-side PM control signals output from the digital core that is connected to the processor, the level shifter circuit is configured to generate level shifted versions of the high-side PM drive signals and the low-side PM drive signals, and the logic circuit configured to monitor the level shifted versions of the high-side PM drive signals and the low-side PM drive signals and detect the one or more absences either the high-side PM signals or the low-side PM signals based on monitoring the level shifted versions of the high-side PM drive signals and the low-side PM drive signals.

Various features and aspects have been described in this disclosure. These and other features and aspects are within the scope of the following claims.

The invention claimed is:

1. A driver circuit configured to control a high-side power switch and a low-side power switch arranged in a half bridge configuration, the driver circuit comprising:
    a high-side driver configured to drive a gate of the high-side power switch based on high-side pulse modulation (PM) signals;
    a low-side driver configured to drive a gate of the low-side power switch based on low-side PM signals; and
    a logic circuit configured to monitor the high-side PM signals and the low-side PM signals,
    wherein the high-side PM signals and the low-side PM signals are configured to turn the high-side power switch and the low-side power switch ON and OFF in a complementary fashion, and
    wherein the logic circuit is configured to detect one or more absences of either the high-side PM signals or the low-side PM signals and generate a fault signal in response to detecting the one or more absences, wherein to detect the one or more absences of either the high-side PM signals or the low side PM signals, the logic circuit comprises a state machine configured to detect low-to-high transitions of the high-side PM signals or the low side PM signals.

2. The driver circuit of claim 1, wherein the logic circuit is configured to communicate the fault signal to a processor.

3. The driver circuit of claim 1,
    wherein the high-side driver is configured to generate high-side PM drive signals based on high-side PM control signals output from a digital core,
    wherein the low-side driver is configured to generate low-side PM drive signals based on low-side PM control signals output from the digital core, and
    wherein the logic circuit is configured to monitor PM control signals and detect the one or more absences of either the high-side PM signals or the low-side PM signals based on monitoring the PM control signals.

4. The driver circuit of claim 3, wherein the PM control signals comprise input signals from a processor to the digital core.

5. The driver circuit of claim 3, wherein the PM control signals comprise the high-side PM control signals output from the digital core to the high-side driver and the low-side PM control signals output from the digital core to the low-side driver.

6. The driver circuit of claim 1, further comprising a level shifter circuit,
    wherein the high-side driver is configured to generate high-side PM drive signals based on high-side PM control signals output from a digital core,
    wherein the low-side driver is configured to generate low-side PM drive signals based on low-side PM control signals output from the digital core,
    wherein the level shifter circuit is configured to generate level shifted versions of the high-side PM drive signals and the low-side PM drive signals, and
    wherein the logic circuit is configured to monitor the level shifted versions of the high-side PM drive signals and the low-side PM drive signals and detect the one or more absences of either the high-side PM signals or the low-side PM signals based on monitoring the level shifted versions of the high-side PM drive signals and the low-side PM drive signals.

7. The driver circuit of claim 1, wherein the logic circuit includes a counter configured to count successive absences of either the high-side PM signals or the low-side PM signals and generate the fault signal in response to a count value of the counter reaching a count threshold.

8. The driver circuit of claim 7, wherein the count threshold is greater than 1 and less than 8.

9. The driver circuit of claim 8, wherein the count threshold is 3.

10. The driver circuit of claim 1, further comprising a plurality of high-side drivers and a plurality of low-side drivers configured to control a plurality of half bridges.

11. The driver circuit of claim 10, wherein the plurality of half bridges is configured to control a multi-phase electric motor.

12. The driver circuit of claim 11, wherein for each of the plurality of half bridges, the driver circuit includes a respective logic circuit configured to detect one or more absences of either the high-side PM signals or the low-side PM signals for a respective one of the plurality of half bridges and generate the fault signal in response to detecting the one or more absences.

13. A method of controlling a high-side power switch and a low-side power switch arranged in a half bridge configuration, the method comprising:
    driving a gate of the high-side power switch based on high-side pulse modulation (PM) signals;
    driving a gate of the low-side power switch based on low-side PM signals; and
    monitoring the high-side PM signals and the low-side PM signals,
    wherein the high-side PM signals and the low-side PM signals are configured to turn the high-side power switch and the low-side power switch ON and OFF in a complementary fashion, and wherein monitoring includes:
  detecting one or more absences of either the high-side PM signals or the low-side PM signals, wherein detecting the one or more absences of either the high-side PM signals or the low side PM signals includes detecting, via a state machine, low-to-high transitions of the high-side PM signals or the low side PM signals; and
  generating a fault signal in response to detecting the one or more absences.

14. The method of claim 13, further comprising:
communicating the fault signal to a processor.

15. The method of claim 13,
wherein a high-side driver is configured to generate high-side PM drive signals based on high-side PM control signals output from a digital core,
wherein a low-side driver is configured to generate low-side PM drive signals based on low-side PM control signals output from the digital core, and
wherein monitoring the high-side PM signals and the low-side PM signals includes monitoring PM control signals and detecting the one or more absences of either the high-side PM signals or the low-side PM signals based on monitoring the PM control signals.

16. The method of claim 13,
wherein a high-side driver is configured to generate high-side PM drive signals based on high-side PM control signals output from a digital core,
wherein a low-side driver is configured to generate low-side PM drive signals based on low-side PM control signals output from the digital core,
wherein a level shifter circuit is configured to generate level shifted versions of the high-side PM drive signals and the low-side PM drive signals, and
wherein monitoring the high-side PM signals and the low-side PM signals includes monitoring the level shifted versions of the high-side PM drive signals and the low-side PM drive signals and detecting the one or more absences of either the high-side PM signals or the low-side PM signals based on monitoring the level shifted versions of the high-side PM drive signals and the low-side PM drive signals.

17. The method of claim 13, further comprising:
maintaining a count value indicative of successive absences of either the high-side PM signals or the low-side PM signals; and
generating the fault signal in response to the count value reaching a count threshold.

18. The method of claim 17, wherein the count threshold is greater than 1 and less than 6.

19. The method of claim 13, wherein the method comprises a method of controlling a plurality of high-side drivers and a plurality of low-side drivers configured to control a plurality of half bridges, wherein the plurality of half bridges is configured to control a multi-phase electric motor.

20. The method of claim 19, further comprising, for each of the plurality of half bridges, detecting one or more absences of either the high-side PM signals or the low-side PM signals for a respective one of the plurality of half bridges and generating the fault signal in response to detecting the one or more absences.

21. A system comprising:
a three-phase electric motor;
a plurality of half bridge circuits each comprising a high-side power switch and a low-side power switch arranged in a half bridge configuration, wherein each of the half bridge circuits controls a respective phase of the three-phase electric motor;
for each of the plurality of half bridge circuits, a respective driver circuit configured to control the high-side power switch and the low-side power switch; and
a processor configured to generate control signals for each of the respective driver circuits, wherein:
each of the respective driver circuits includes:
a logic circuit configured to monitor high-side pulse modulation (PM) signals and low-side PM signals,
wherein the high-side PM signals and the low-side PM signals are configured to turn the high-side power switch and the low-side power switch ON and OFF in a complementary fashion, and
wherein the logic circuit is configured to detect one or more absences of either the high-side PM signals or the low-side PM signals and generate a fault signal in response to detecting the one or more absences, wherein to detect the one or more absences of either the high-side PM signals or the low side PM signals, the logic circuit comprises a state machine configured to detect low-to-high transitions of the high-side PM signals or the low side PM signals.

22. The system of claim 21, wherein for each of the respective driver circuits:
a high-side driver is configured to generate high-side PM drive signals based on high-side PM control signals output from a digital core that is connected to the processor,
a low-side driver is configured to generate low-side PM drive signals based on low-side PM control signals output from the digital core that is connected to the processor, and
the logic circuit is configured to monitor PM control signals and detect the one or more absences either the high-side PM signals or the low-side PM signals based on monitoring the PM control signals.

23. The system of claim 21, wherein each of the respective driver circuits includes a level shifter circuit, wherein for each of the respective driver circuits:
a high-side driver is configured to generate high-side PM drive signals based on high-side PM control signals output from a digital core that is connected to the processor,
a low-side driver is configured to generate low-side PM drive signals based on low-side PM control signals output from the digital core that is connected to the processor,
the level shifter circuit is configured to generate level shifted versions of the high-side PM drive signals and the low-side PM drive signals, and
the logic circuit is configured to monitor the level shifted versions of the high-side PM drive signals and the low-side PM drive signals and detect the one or more absences either the high-side PM signals or the low-side PM signals based on monitoring the level shifted versions of the high-side PM drive signals and the low-side PM drive signals.

* * * * *